US009343614B2

(12) United States Patent
Oh et al.

(10) Patent No.: US 9,343,614 B2
(45) Date of Patent: May 17, 2016

(54) SUPERLUMINESCENT DIODE, METHOD OF MANUFACTURING THE SAME, AND WAVELENGTH-TUNABLE EXTERNAL CAVITY LASER INCLUDING THE SAME

(71) Applicant: Electronics and Telecommunications Research Institute, Daejeon (KR)

(72) Inventors: Su Hwan Oh, Daejeon (KR); Ki-Hong Yoon, Daejeon (KR); Kisoo Kim, Daejeon (KR); O-Kyun Kwon, Daejeon (KR); Oh Kee Kwon, Daejeon (KR); Byung-Seok Choi, Daejeon (KR); Jongbae Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/616,149

(22) Filed: Feb. 6, 2015

(65) Prior Publication Data
US 2015/0155428 A1      Jun. 4, 2015

Related U.S. Application Data

(62) Division of application No. 13/486,698, filed on Jun. 1, 2012, now Pat. No. 8,989,229.

(30) Foreign Application Priority Data

Jun. 2, 2011      (KR) .................... 10-2011-0053198

(51) Int. Cl.
*H01L 33/00* (2010.01)
*H01S 5/026* (2006.01)
(Continued)

(52) U.S. Cl.
CPC .............. *H01L 33/005* (2013.01); *B82Y 20/00* (2013.01); *H01L 33/0045* (2013.01);
(Continued)

(58) Field of Classification Search
CPC ....... H01S 5/026; H01S 5/141; H01S 5/1014; H01S 5/2213; H01S 5/14; H01L 33/0045; H01L 33/005; H01L 2933/0058
See application file for complete search history.

(56) References Cited

U.S. PATENT DOCUMENTS

2009/0154514 A1      6/2009   Oh et al.
2010/0014545 A1      1/2010   Lee et al.
(Continued)

FOREIGN PATENT DOCUMENTS

KR      2008-0052319 A      6/2008

OTHER PUBLICATIONS

Su Hwan Oh, et al., "Tunable external cavity laser employing uncooled superluminescent diode", Optics Express, vol. 17, No. 12, pp. 10189-10194 (2009).

(Continued)

*Primary Examiner* — Yuanda Zhang
*Assistant Examiner* — Michael Carter
(74) *Attorney, Agent, or Firm* — Rabin & Berdo, P.C.

(57) ABSTRACT

Provided are a high-speed superluminescent diode, a method of manufacturing the same, and a wavelength-tunable external cavity laser including the same. The superluminescent diode includes a substrate having an active region and an optical mode size conversion region, waveguides including an ridge waveguide in the active region and a deep ridge waveguide in the optical mode size conversion region connected to the active waveguide, an electrode disposed on the ridge waveguide; planarizing layers disposed on sides of the ridge waveguide and the deep ridge waveguide on the substrate, and a pad electrically connected to the electrode, the pad being disposed on the planarizing layers outside the active waveguide.

8 Claims, 22 Drawing Sheets

(51) Int. Cl.
- *H01S 5/14* (2006.01)
- *H01L 33/20* (2010.01)
- *B82Y 20/00* (2011.01)
- *H01S 5/022* (2006.01)
- *H01S 5/062* (2006.01)
- *H01S 5/10* (2006.01)
- *H01S 5/223* (2006.01)
- *H01S 5/343* (2006.01)
- *H01S 5/22* (2006.01)
- *G02B 6/30* (2006.01)
- *G02B 6/42* (2006.01)

(52) U.S. Cl.
CPC ............... *H01L 33/20* (2013.01); *H01S 5/026* (2013.01); *H01S 5/141* (2013.01); *G02B 6/305* (2013.01); *G02B 6/4206* (2013.01); *H01L 2933/0016* (2013.01); *H01L 2933/0058* (2013.01); *H01S 5/02216* (2013.01); *H01S 5/02284* (2013.01); *H01S 5/06226* (2013.01); *H01S 5/101* (2013.01); *H01S 5/1014* (2013.01); *H01S 5/2213* (2013.01); *H01S 5/2224* (2013.01); *H01S 5/2231* (2013.01); *H01S 5/34306* (2013.01); *H01S 2301/176* (2013.01)

(56) References Cited

U.S. PATENT DOCUMENTS

| | | |
|---|---|---|
| 2010/0034223 A1 | 2/2010 | Osinski et al. |
| 2010/0119231 A1 | 5/2010 | Kim et al. |
| 2010/0238962 A1* | 9/2010 | Oh .......................... H01S 5/14 372/45.01 |

OTHER PUBLICATIONS

Young-Ouk Noh, et al., "Continuously tunable compact lasers based on thermo-optic polymer waveguides with Bragg gratings", Optics Express, vol. 16, No. 22, pp. 18194-18201 (2008).

R. Paoletti, et al., "15-GHz Modulation Bandwidth, Ultralow-Chirp 1.55- μm Directly Modulated Hybrid Distributed Bragg Reflector (HDBR) Laser Source", IEEE photonics technology letters, vol. 10, No. 12, pp. 1691-1693 (1998).

F.N. Timofeev, et al., "10Gbit/s directly modulated, high temperature-stability external fibre grating laser for dense WDM networks" IEE Electronics letters, vol. 35, No. 20, pp. 1737-1739 (1999).

Baijun Zhang, et al., "High-Speed and High-Power 1.3 μm InGaAsP/InP Selective Proton-Bombarded Buried Crescent Lasers with Optical Field Attenuation Regions", Jpn. J. Appl. Phys. vol. 38, pp. 6729-6731 (1999).

Masaki Kohtoku, et al., "High-Speed InGaAlAs—InAlAs MQW Directional CouplerWaveguide Switch Modules Integrated with a Spotsize Converter Having a Lateral Taper, Thin-Film Core, and Ridge", Journal of Lightwave Technology, vol. 18, No. 3, pp. 360-369 (2000).

* cited by examiner

SUPERLUMINESCENT DIODE, METHOD OF MANUFACTURING THE SAME, AND WAVELENGTH-TUNABLE EXTERNAL CAVITY LASER INCLUDING THE SAME

CROSS-REFERENCE TO RELATED APPLICATIONS

This is a division of application Ser. No. 13/486,698, filed Jun. 1, 2012. Furthermore, this U.S. non-provisional patent application claims priority under 35 U.S.C. §119 of Korean Patent Application No. 10-2011-0053198, filed on Jun. 2, 2011, the entire contents of which are hereby incorporated by reference.

BACKGROUND OF THE INVENTION

The present invention disclosed herein relates to a superluminescent diode and a method of manufacturing the same, and more particularly, to a high-speed operable superluminescent diode, a method of manufacturing the same, and a wavelength-tunable external cavity laser including the same.

Wavelength division multiplexing (hereinafter, referred to as a "WDM") is the next-generation optical transmission technology for increasing communication capacity and speed. To realize economical WDM optical access network systems, it is necessary to develop light sources which are stable and have a low-cost light source. For example, the WDM optical access network systems may be realized using planar lightwave circuit external cavity lasers (hereinafter, referred to as "PLC-ECLs") using low-cost polymer and silica waveguides.

The Bragg grating of a PLC-ECL is disposed on silica and polymer waveguides on a silicon substrate, and a light source of that is hybrid integrated with a PLC device. The superluminescent diode (SLD) has been used as a suitable light source for the PLC-ECL, since its spectral width can cover the full band of WDM optical access network systems and it has a characteristic of stable reflectivity of less than 0.1% due to avoid reflection at the interface between the SLD and the PLC device. The performance of PLC-ECL is affected by the characteristics of SLD. The SLD usually has a wide spectral width, there is a limit in the reflectivity reduction achievable by using only an antireflection (AR)-coating. To reduce the reflectivity and to obtain a ripple less than 3 dB, the waveguide is tilted by 7-15° with respect to the cleaved facet, and front facet is AR-coated.

SUMMARY OF THE INVENTION

The present invention provides a superluminescent diode which is operated at a high speed of about 10 Gbps or more, a method of manufacturing the same, and a wavelength-tunable external cavity laser including the same.

Embodiments of the present invention provide superluminescent diodes including a substrate having an active region and an optical mode size conversion region; waveguides comprising an active waveguide in the active region, a junction waveguide and a passive waveguide in the optical mode size conversion region connected to the active waveguide; an electrode disposed on the active waveguide; planarizing layers disposed on a outside region of the ridge waveguide and the deep ridge waveguide on the substrate; and a pad electrically connected to the electrode, the pad being disposed on the planarizing layers at the outside region of the ridge waveguide.

In some embodiments, the planarizing layers may include polyimide or polymer benzocyclobutene (BCB).

In other embodiments, the active waveguide may include: a lower clad layer disposed on the substrate; an active layer disposed on the lower clad layer; a first upper clad layer disposed on the active layer; an etch stop layer disposed on the first upper clad layer; a second upper clad layer extending in one direction on the etch stop layer; and an ohmic contact layer disposed on the second upper clad layer.

In still other embodiments, the second upper clad layer may have a reverse mesa structure or forward mesa structure.

In even other embodiments, the superluminescent diodes may further include a passive waveguide layer disposed between the lower clad layer and the substrate.

In yet other embodiments, each of the junction waveguide and the passive waveguide may include a deep ridge type waveguide extending from the active waveguide.

In further embodiments, the junction waveguide may include: the lower clad layer disposed on the passive waveguide layer extending from the active waveguide; a junction layer disposed on the lower clad layer; the second upper clad layer extending from the active waveguide, wherein the lower clad layer and the junction layer may include a linear waveguide region, a bent waveguide region, and a taped waveguide region.

In still further embodiments, the passive waveguide may include: a buffer layer disposed on the substrate; the passive waveguide layer disposed on the buffer layer; and the second upper clad layer surrounding the passive waveguide layer and the buffer layer.

In even further embodiments, the second upper clad layer may have a high level in the optical mode size conversion region than the active region.

In other embodiments of the present invention, methods of manufacturing a superluminescent diode include: forming a passive waveguide layer, a lower clad layer, an active layer, and a first upper clad layer on a substrate having an active region and an optical mode size conversion region; removing the active layer and the first clad layer in the optical mode size conversion region; forming a junction layer on the lower clad layer and patterning the junction layer and the lower clad layer to form a junction waveguide in the optical mode size conversion region; patterning the passive waveguide layer and the substrate under the junction waveguide to form a passive waveguide in the optical mode size conversion region; and forming a second upper clad layer having a mesa structure on the first upper clad layer of the active region and surrounding the junction waveguide and the passive waveguide in the optical mode size conversion region.

In some embodiments, the methods may further include forming an etch stop layer and a first cap layer on the first upper clad layer.

In other embodiments, the junction layer may be butt-regrown with the same thickness as that of the active layer of the active region.

In still other embodiments, the methods may further include forming a second cap layer having the same thickness as that of each of the first upper clad layer, the etch stop layer, and the first cap layer on the junction layer.

In even other embodiments, the second upper clad layer may include doped p-InP equal to that of each of the first and second cap layers.

In yet other embodiments, the second upper clad layer of the optical mode size conversion region may be formed through a selective growth method.

In further embodiments, the selective growth method may include: forming mask patterns on both sides of the junction waveguide and the passive waveguide; and forming the second upper clad layer on the junction waveguide, the passive waveguide, and the substrate which are exposed by the mask patterns.

In still further embodiments, the method may further include: forming planarizing layers on both sides of the active waveguide, the junction waveguide, the passive waveguide on the substrate; and forming an electrode and a pad on an ohmic contact layer and the planarizing layer.

In still other embodiments of the present invention, wavelength-tunable external cavity lasers include: a housing; an optical fiber withdrawn from one side of the inside of the housing to the outside; a planar lightwave circuit (PLC) device disposed within the other side of the inside of the housing facing the optical fiber; and a superluminescent diode comprising: a substrate having an active region and an optical mode size conversion region between the PLC device and the optical fiber; ridge type waveguides including an active waveguide in the active region, a junction waveguide and a passive waveguide in the optical mode size conversion region connected to the active waveguide; an electrode disposed on the active waveguide; planarizing layers disposed on both sides of the electrode and the ridge type waveguides on the substrate; and a pad electrically connected to the electrode and disposed on the planarizing layers outside the active waveguide.

In some embodiments, the PLC device may include a polymer optical waveguide, a Bragg grating, and a high reflective coating.

In other embodiments, the superluminescent diode may further include a low reflective coating disposed on a facet of the active waveguide adjacent to the optical fiber.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
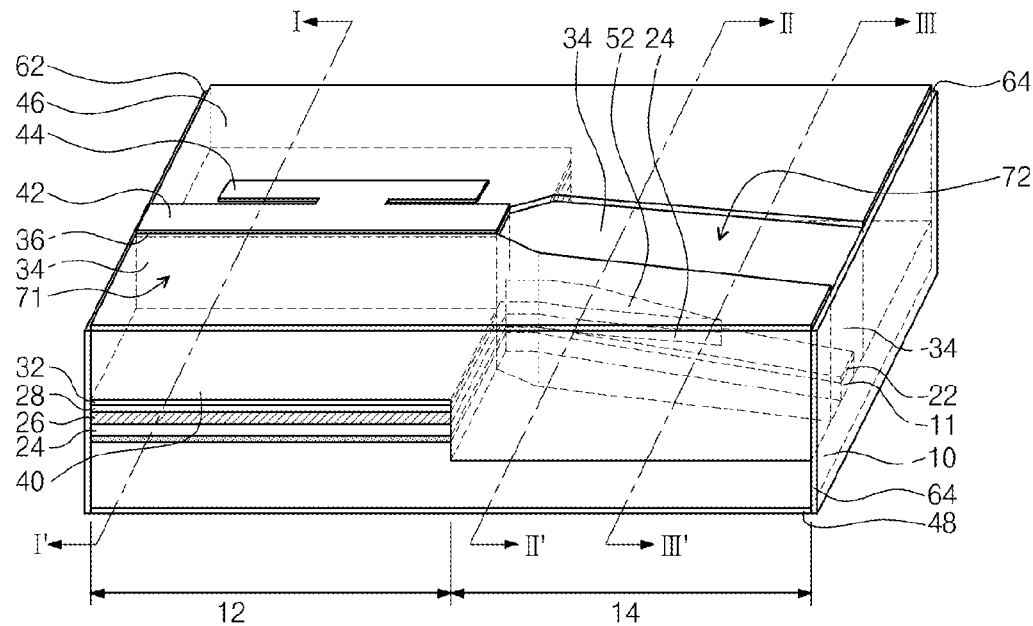
FIGS. 1 and 2 are perspective and floor plan views of a superluminescent diode according to an embodiment of the inventive concept, respectively.

Preferred embodiments of the inventive concept will be described below in more detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

In the following description, the technical terms are used only for explaining a specific exemplary embodiment while not limiting the inventive concept. The terms of a singular form may include plural forms unless specifically mentioned. The meaning of 'comprises' and/or 'comprising' specifies a component, a process, an operation and/or an element but does not exclude other components, processes, operations, and/or elements. Since preferred embodiments are provided below, the order of the reference numerals given in the description is not limited thereto. In the specification, it will be understood that when a layer (or film) is referred to as being 'on' another layer or substrate, it can be directly on the other layer or substrate, or intervening layers may also be present.

Figure 2:
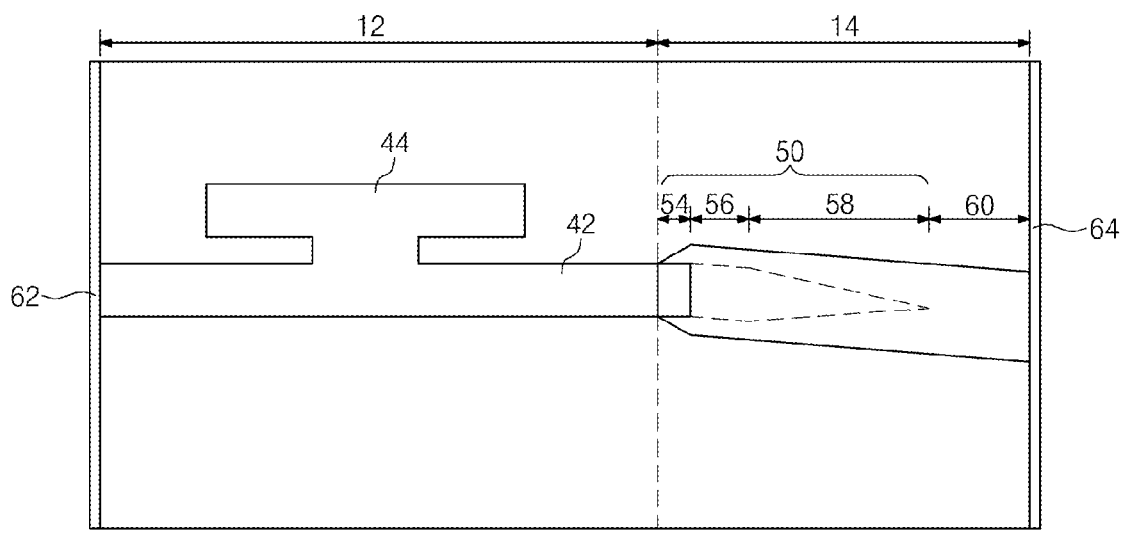
Figure 3:
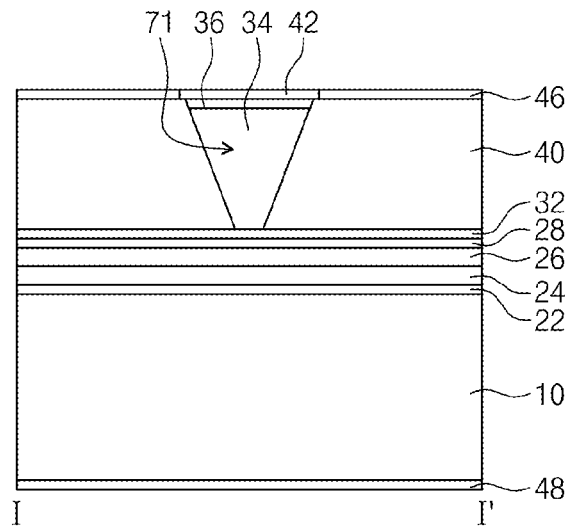
FIGS. 3 and 4 are cross-sectional views taken along line I-I' of FIG. 1.
Figure 4:
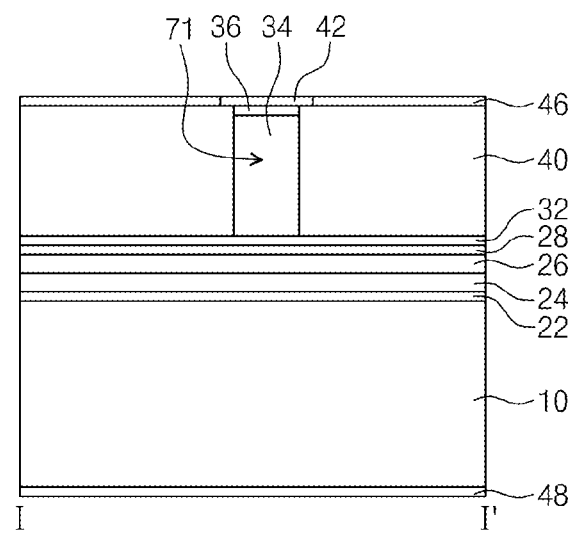
Figure 5:
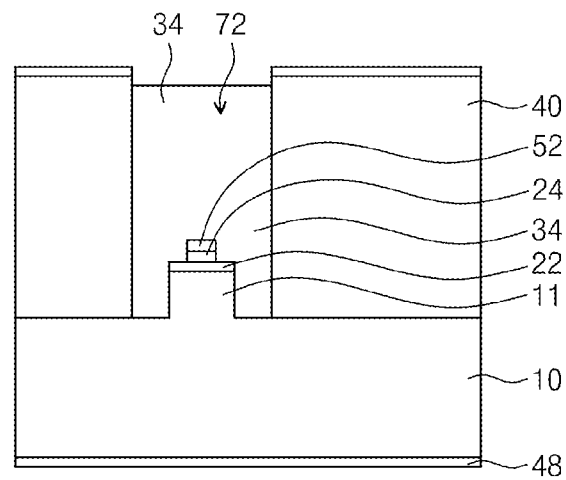
FIGS. 5 and 6 are cross-sectional views taken along line II-II' and III-III' of FIG. 1.
Figure 6:
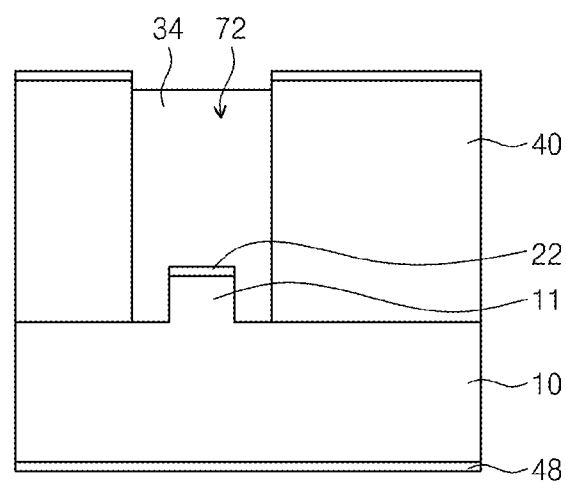

FIGS. 1 and 2 are perspective and floor plan views of a superluminescent diode according to an embodiment of the inventive concept, respectively. FIGS. 3 and 4 are cross-sectional views taken along line I-I' of FIG. 1. FIGS. 5 and 6 are sectional views taken along line II-II' and III-III' of FIG. 1.

Referring to FIGS. 1 to 6, a superluminescent diode 100 according to an embodiment of the inventive concept may include a ridge waveguide 71 in an active region 12 of a substrate 10, a deep ridge waveguide region 72 in an optical mode size conversion region 14, and a planarizing layer 40 disposed outside each of the ridge waveguide 71 the tapered waveguide region 50 and the deep ridge waveguide 72. The planarizing layer 40 may include polyimide or polymer benzocyclobutene (BCB). A first pad 44 may be disposed on the planarizing layer 40. The first pad 44 may be connected to an upper electrode 42 disposed on the ridge waveguide 71. The planarizing layer 40 may minimize a parasitic capacitance between the active layer 26 and the first pad 44.

Thus, the superluminescent diode according to an embodiment of the inventive concept may be operated at a high speed.

The laser beam maybe generated by current applied into the upper electrode 42 and the first pad 44 in the active region 12. A lower clad layer 24, an active layer 26, a first upper clad layer 28, an etch stop layer 32, a second upper clad layer 34, an ohmic contact layer 36, and the upper electrode 42 may be disposed on the active region 12. The second upper clad layer 34 and the ohmic contact layer 36 may be ridge waveguide 71.

The lower clad layer 24 may include n-InP. The active layer 26 may include a tensile-strained InGaAsP bulk having a TE (transverse electric wave)/TM (transverse magnetic wave) polarization characteristic ratio of about 1:1 or a strain-relaxation InGaAsP/InGaAsP (compressive-strained/tensile-strained) multi-quantum well having a superior gain characteristic. The first upper clad layer 28 may include p-InP. The etch stop layer 32 may include InGaAsP. The second upper clad layer 34 may include p-InP. The second clad layer 34 may have a reverse mesa structure (see FIG. 3) or a vertical mesa structure (see FIG. 4). The passive waveguide layer 22 and the lower clad layer 24 may be disposed between the substrate 10 and the active layer 26. A neck width of the second clad layer 34 may have a width of about 2 μm to about 4 μm so as to perform a lateral single mode operation.

The optical mode size conversion region 14 may include the deep ridge waveguide 72 connected to ridge waveguide 71. The deep ridge waveguide 72 includes the tapered waveguide region 50 and the passive waveguide region 60 extending from the ridge waveguide region 71. The tapered waveguide region 50 may include a linear waveguide region 54, a bent waveguide region 56, and a taped waveguide region 58. The passive waveguide region 60 may include a deep ridge type waveguide. The passive waveguide region 60 may include a buffer layer 11, the passive waveguide layer 22 disposed on the buffer layer 11, and a second upper clad layer 34 formed by being regrown on the passive waveguide layer 22 and the buffer layer 11. The width of passive waveguide 60 may have about 2 μm to about 7 μm.

Figure 7:
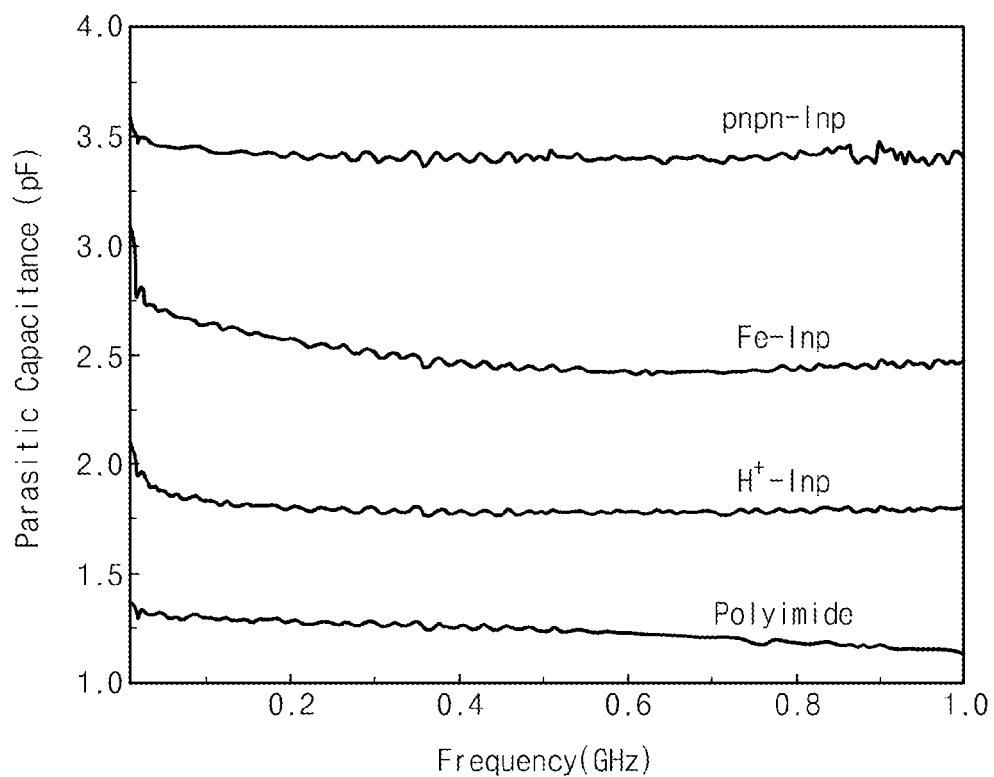
FIG. 7 is a comparison graph illustrating a variation in parasitic capacitances according to kinds of planarizing layers of FIG. 1.

FIG. 7 is a comparison graph illustrating a variation in parasitic capacitances according to kinds of planarizing layers of FIG. 1.

Referring to FIGS. 1 to 7, the planarizing layer 40 formed of an InP material may have a minimum parasitic capacitance. Here, a horizontal axis represents a frequency of current applied to the upper electrode 42 and the first pad 44, and a vertical axis represents values of the parasitic capacitance. The planarizing layer 40 may be a current blocking layer surrounding the ridge waveguide 71. The planarizing layer 40 formed of pnpn InP may have a parasitic capacitance of about 3.5 pF at a frequency of about 10 GHz. The planarizing layer 40 formed of InP doped with iron (Fe) may have a parasitic capacitance of about 2.5 pF at the frequency of about 10 GHz. The planarizing layer 40 formed of InP doped with hydrogen (H+) may have a parasitic capacitance of about 2.0 pF at the frequency of about 10 GHz. The planarizing layer 40 formed of a polyimide material may have a parasitic capacitance of about 1.25 pF at the frequency of about 10 GHz. The polyimide planarizing layer 40 may minimize a parasitic capacitance between the active layer 26 and the first pad 44. Although not shown in FIG. 7, the planarizing layer 40 may include polymer BCB. The value of the parasitic capacitance may serve as a function which decides a 3-dB modulation frequency bandwidth of a semiconductor laser. Also, the value of the parasitic capacitance is in inverse proportion to the response characteristic or operation speed.

Figure 8:
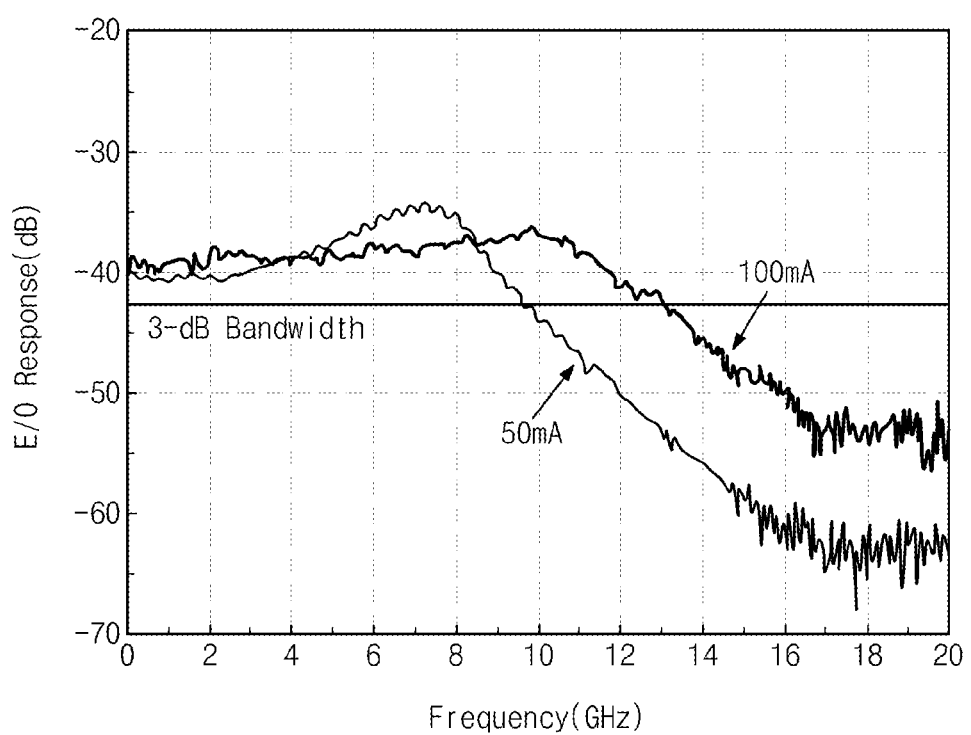
FIG. 8 is a graph illustrating E/O response characteristics of the superluminescent diode according to an embodiment of the inventive concept.

FIG. 8 is a graph illustrating E/O (electric-to-optic) response characteristics of the superluminescent diode according to an embodiment of the inventive concept.

Referring to FIGS. 1 to 8, the superluminescent diode according to an embodiment of the inventive concept may have a 3-dB bandwidth of about 10 GHz at an injection current of about 50 mA and a 3-dB bandwidth of about 13 GHz at an injection current of about 100 mA. Here, a horizontal axis represents a frequency with an input current, a vertical axis represents a 3-dB bandwidth with a response characteristic. A value of the 3-dB bandwidth is obtained by the laser diode including the ridge waveguide 71. A modulation frequency characteristic at a current condition below a critical current may have a significant narrow 3-dB bandwidth of about 2 GHz.

Thus, the superluminescent diode according to an embodiment of the inventive concept may be operated at a high speed due to the minimized parasitic capacitance.

Figure 9:
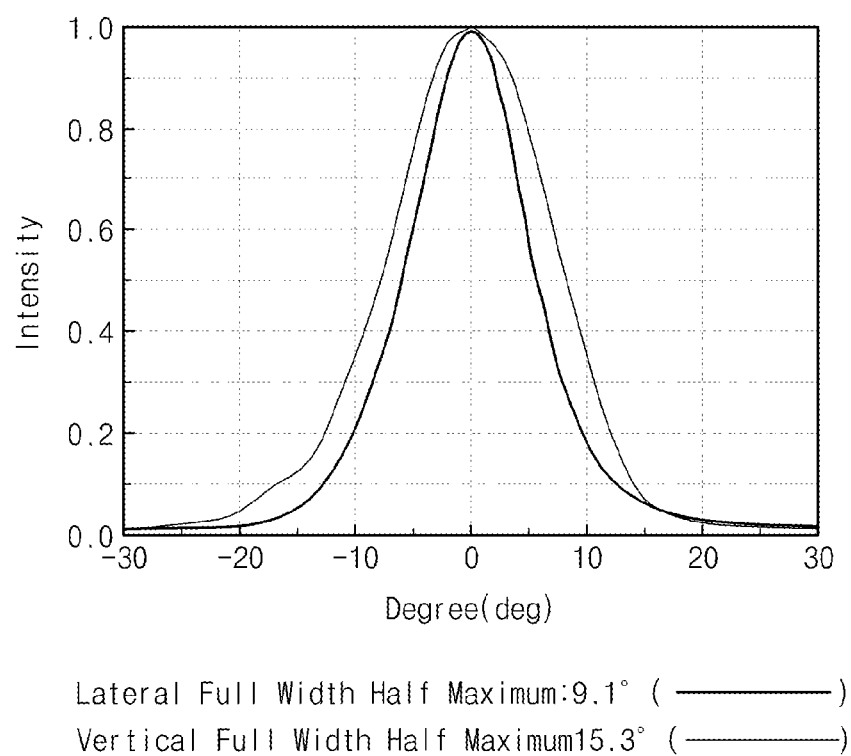
FIG. 9 is a graph illustrating full width half maximum (FWHM) characteristics of the superluminescent diode according to an embodiment of the inventive concept.

FIG. 9 is a graph illustrating full width half maximum (FWHM) of FFP (far field pattern) characteristics of the superluminescent diode according to an embodiment of the inventive concept.

Referring to FIGS. 1 to 9, the superluminescent diode according to an embodiment of the inventive concept may have a FFP characteristic ratio of about 5:3 with respect to vertical and lateral laser light. Here, a horizontal axis represents a radiation angle of laser beam, and a vertical axis represents an intensity of a laser beam. Here, the vertical FWHM of FFP may have an angle of about 15.3°. A typical ridge waveguide type laser diode has a FFP characteristic ratio of about 3:1 or about 4:1 with respect to the vertical and lateral laser beam. The laser beam may have a shape approaching a circular shape when the FFP characteristic ratio of the vertical FWHM and the lateral FWHM is less. The circular laser beam may increase a far field pattern characteristic.

Thus, the superluminescent diode according to an embodiment of the inventive concept may have a superior FFP (far field pattern) characteristic.

A method of manufacturing the superluminescent diode according to an embodiment of the inventive concept will be described below.

FIGS. 10 to 19 are perspective views illustrating a process of manufacturing the superluminescent diode according to an embodiment of the inventive concept.

Figure 10:
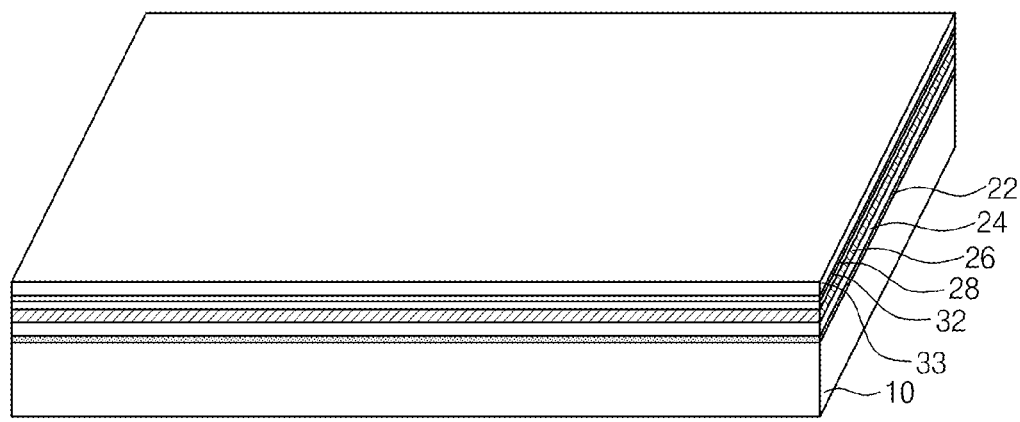
FIGS. 10 to 19 are perspective views illustrating a process of manufacturing the superluminescent diode according to an embodiment of the inventive concept.

Referring to FIG. 10, a passive waveguide layer 22, a lower clad layer 24, an active layer 26, a first upper clad layer 28, an etch stop layer 32, and a first cap layer 33 are successively stacked on a substrate 10. The substrate 10 may include n-InP. The passive waveguide layer 22 may include InGaAsP with a thickness of about 100 nm to about 150 nm. The lower clad layer 24 may include n-InP with a thickness of about 0.4 μm to about 1 μm. The active layer may include a tensile-strained InGaAsP bulk layer having a TE/TM polarization characteristic ratio of about 1:1 or an InGaAsP (compressive-strained active layer)/InGaAsP (tensile-strained barrier layer) multi-quantum well having a superior gain characteristic. The first upper clad layer 28 may include p-InP with a thickness of about 30 nm to about 100 nm. The etch stop layer 32 may include InGaAsP with a thickness of about 10 nm to about 20 nm. The first cap layer 33 may include p-InP with a thickness of about 100 nm. Although not shown, an n-InP buffer layer may be formed between the substrate 10 and the passive waveguide layer 22.

Figure 11:
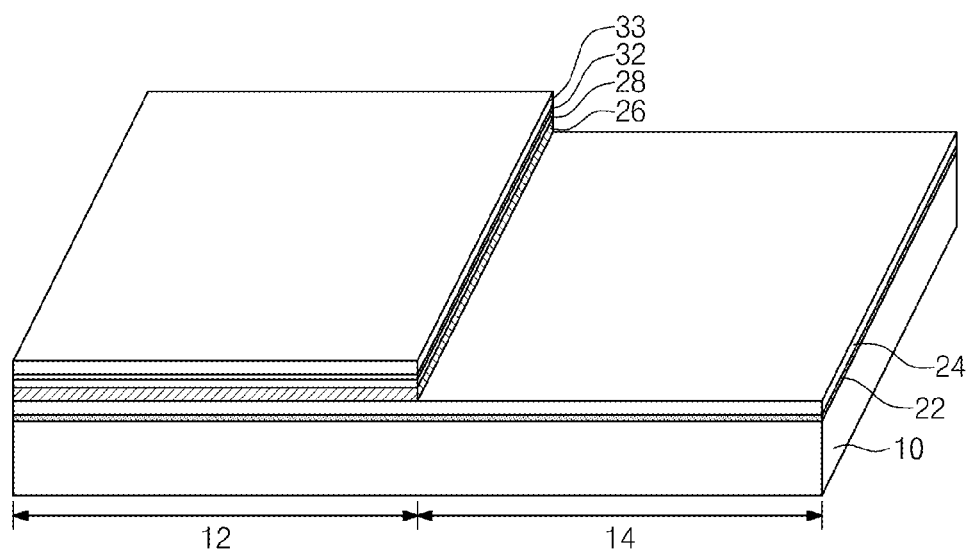

Referring to FIG. 11, the first cap layer 33, the etch stop layer 32, the first upper clad layer 28, and the active layer 26 in an optical mode size conversion region 14 of the substrate 10 are removed. The first cap layer 33, the etch stop layer 32, the first upper clad layer 28, and the active layer 26 may be removed using a photolithograph process, a dry etching process, and a selective etching process.

Figure 12:
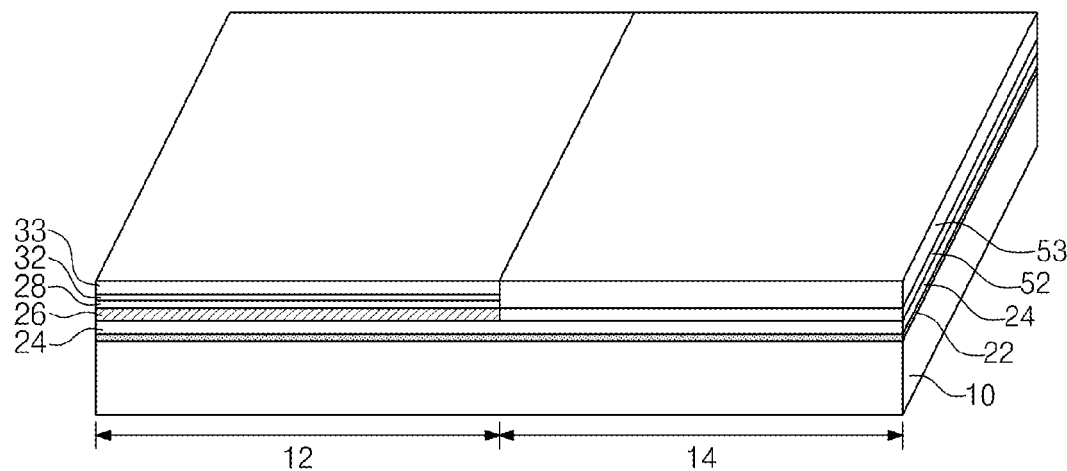

Referring to FIG. 12, a junction waveguide layer 52 and a second cap layer 53 are formed on the optical mode size conversion region 14. The junction waveguide layer 52 may be butt-regrown from the active layer 26 of the active region 12. The junction waveguide layer 52 may include an InGaAsP layer with the same thickness as that of the active layer 26. The second cap layer 53 may have the same thickness as that of each of the first upper clad layer 28, the etch stop layer 32, and the first cap layer 33. The second cap layer 53 may include p-InP with a thickness of about 100 nm.

Figure 13:
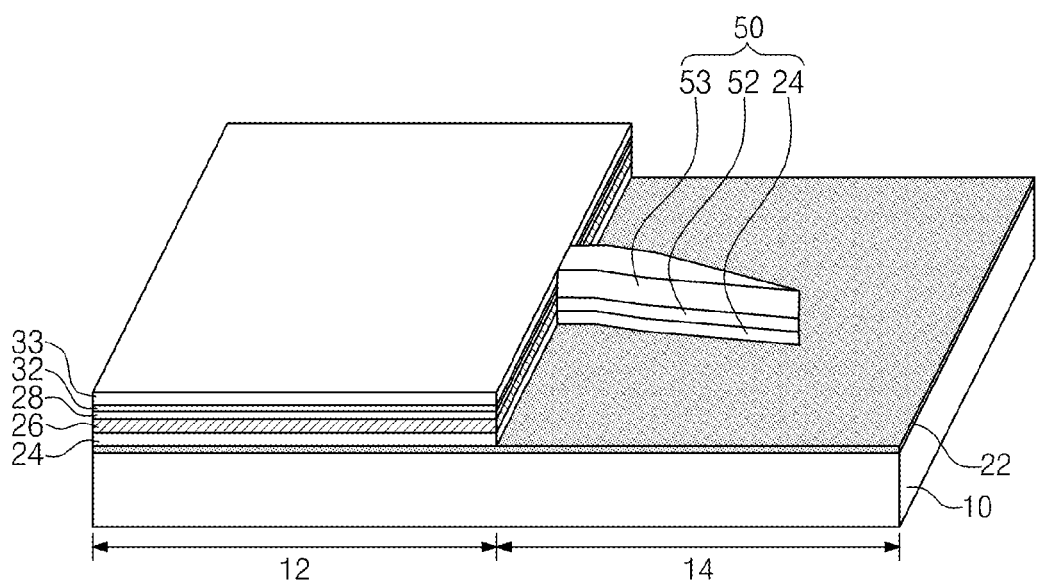

Referring to FIGS. 2 and 13, a tapered waveguide region 50 is formed in the optical mode size conversion region 14. The tapered waveguide region 50 may include the lower clad layer 24, the junction waveguide layer 52, and the second cap layer 53. The tapered waveguide region 50 may be formed through a photolithography process, a dry etching process, and a wet etching process. The tapered waveguide region 50 may include a linear waveguide region 54, a bent waveguide region 56, and a taped waveguide region 58.

Figure 14:
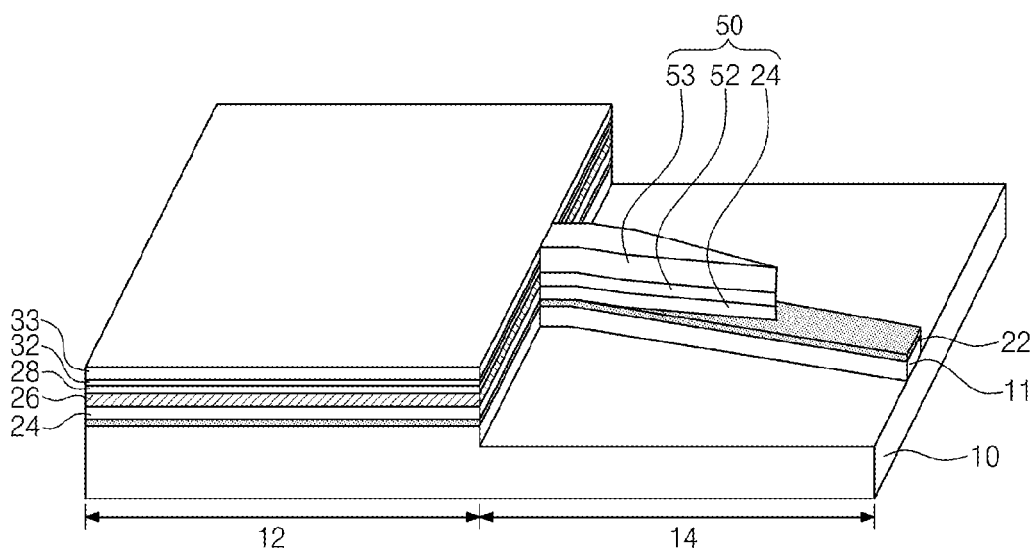

Referring to FIGS. 2 and 14, the passive waveguide layer 22 and the buffer layer 11 are patterned by a direction extending to the tapered waveguide region 50. The passive waveguide layer 22 and the buffer layer 11 may be extended the passive waveguide region 60. The width of passive waveguide layer 22 in the passive waveguide region 60 may have an about 2 μm to about 7 μm.

Figure 15:
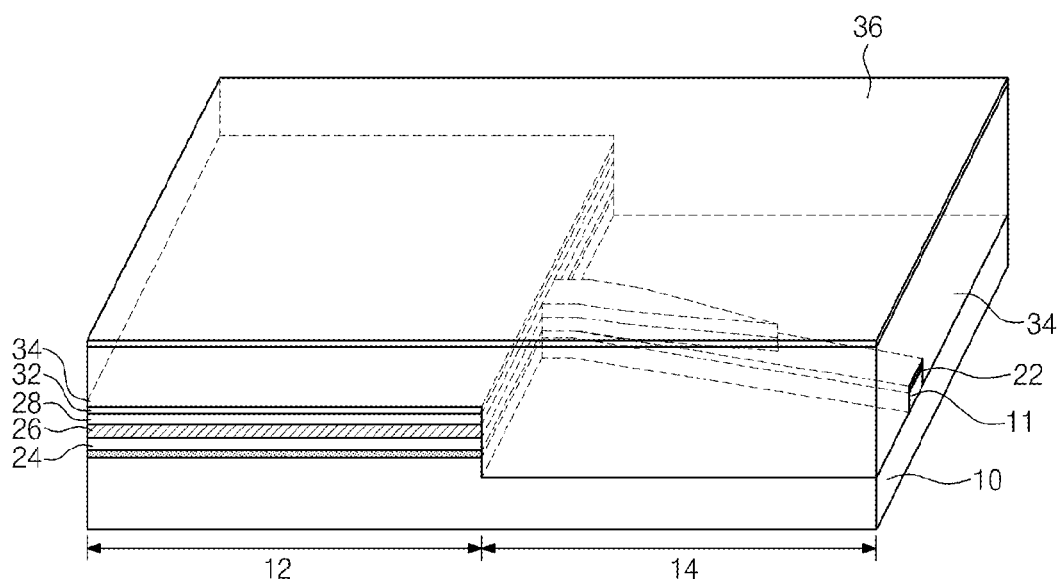
Figure 16:
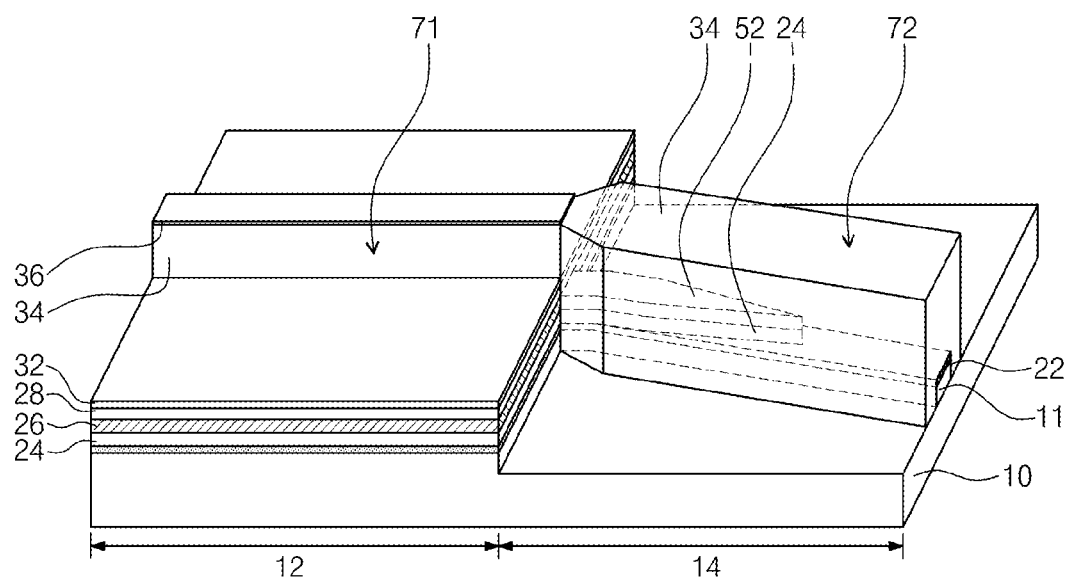

Referring to FIG. 15, a second upper clad layer 34 and an ohmic contact layer 36 are formed on an entire surface of the substrate 10. The second upper clad layer 34 may include p-InP with a thickness of about 1.7 μm to about 3 μm. The second upper clad layer 34 may include p-InP equal to that of each of the first and second cap layers 33 and 53. The ohmic contact layer 36 may include p+-InGaAs with a thickness of about 0.1 μm to about 0.3 μm.

Referring to FIGS. 2, 3, 4, and 16, the ohmic contact layer 36 and the second upper clad layer 34 may be patterned to form a ridge waveguide 71 in the active region 12 and a deep ridge waveguide 70 in the optical mode size conversion region 14. The ridge waveguide 71 may include the second upper clad layer 34, and the ohmic contact layer 36 on the etch stop layer 32. The second upper clad layer 34 and the ohmic contact layer 36 may have a reverse mesa structure (FIG. 3) or a forward mesa structure (FIG. 4) in the active region 12

Figure 17:
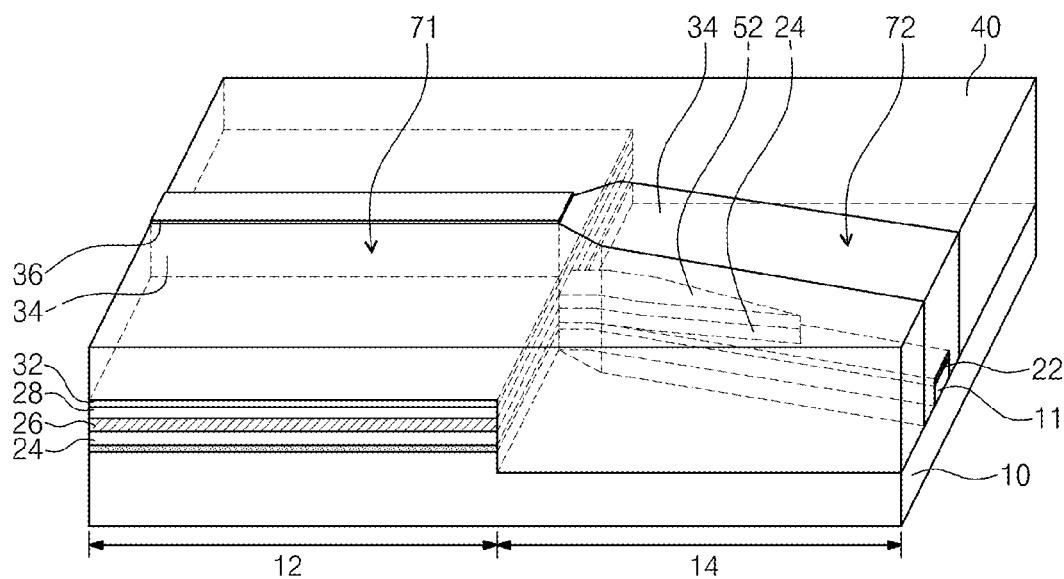

Referring to FIG. 17, a planarizing layer 40 is formed on the active region 12 and the optical mode size conversion region 14. The planarizing layer 40 may include polyimide or polymer BCB formed through spin coating. The planarizing layer 40 may be a current blocking layer surrounding the periphery of the ridge waveguide 71.

Figure 18:
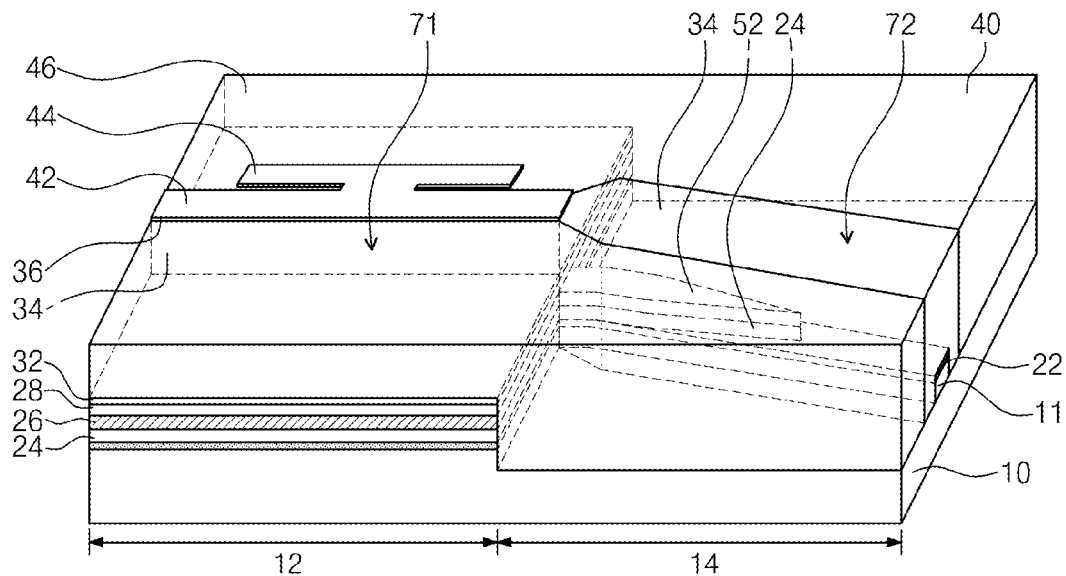

Referring to FIG. 18, an upper electrode 42 and a first pad 44 are formed on the ohmic contact layer 36 and the planarizing layer 40 of the active region 12, respectively. Each of the p-type upper electrode 42 and the first pad 44 may be formed of a conductive metal. The upper electrode 42 and the first pad 44 may be patterned through a photolithography process. The planarizing layer 40 may minimize a parasitic capacitance between the active layer 26 and the first pad 44.

Figure 19:
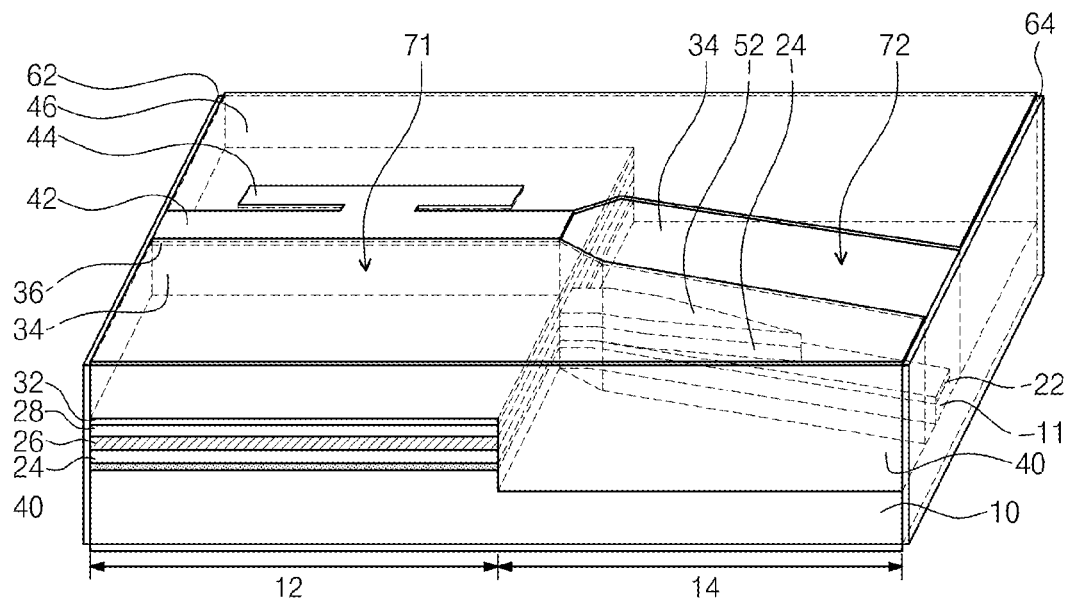

Referring to FIG. 19, a dielectric 46 is formed on the planarizing layer 40. Also, a high-reflective (HR) coating 62 is formed on a rear facet of the active region 12, and an anti-reflective (AR) coating 64 is formed on a front facet of the optical mode size conversion region 14. A lower electrode 48 is formed on a bottom of the substrate 10. The dielectric 46 may include a silicon nitride layer and a dioxide silicon layer. The n-type lower electrode 48 may be formed of a conductive metal.

A superluminescent diode according to another embodiment of the inventive concept may include a second upper clad layer 34 having thicknesses different from each other in the active region 12 and the optical mode size conversion region 14 according to an embodiment of the inventive concept.

Figure 20:
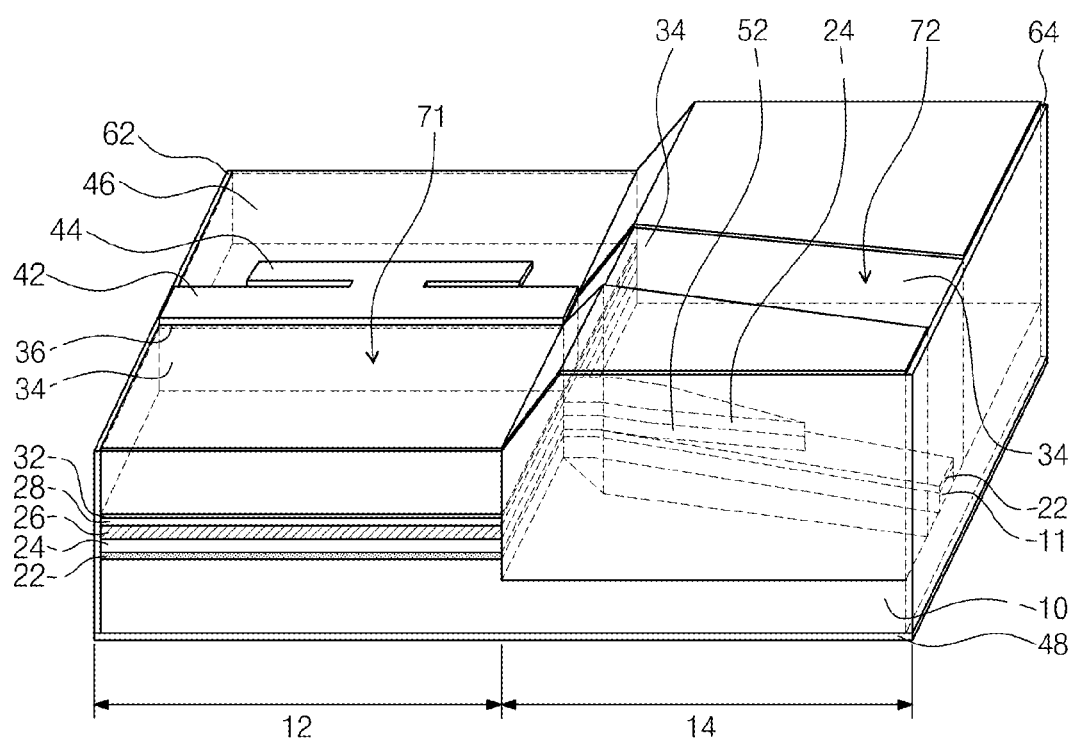
FIG. 20 is a perspective view of a superluminescent diode according to another embodiment of the inventive concept.
Figure 21:
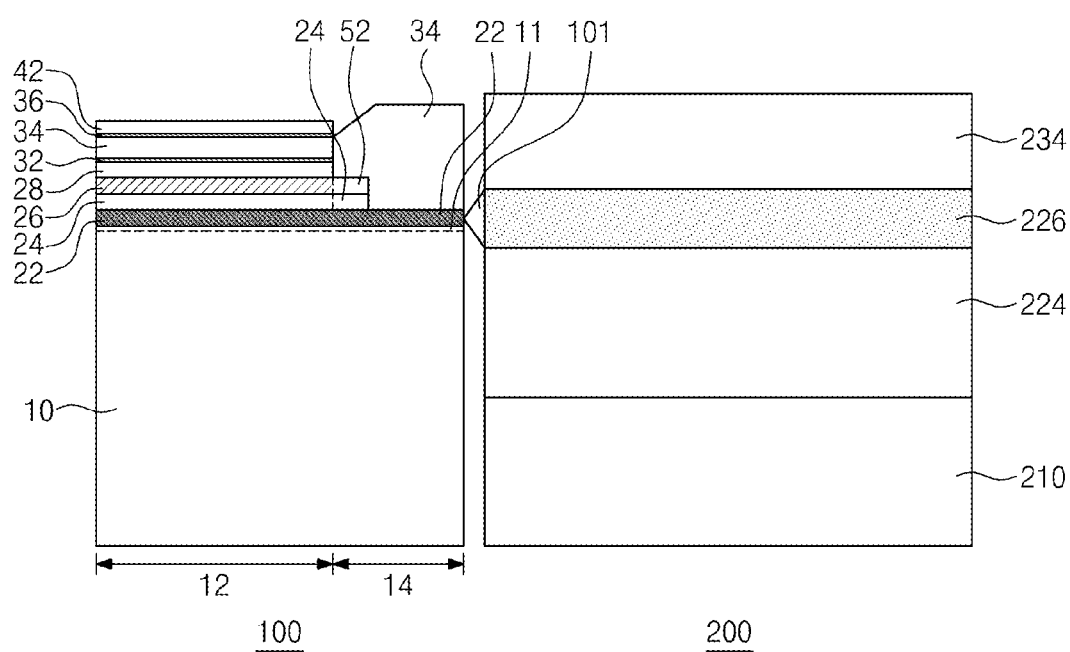
FIG. 21 is a side-sectional view illustrating optical coupling between the superluminescent diode and a planar lightwave circuit (PLC) device of FIG. 20.

FIG. 20 is a perspective view of a superluminescent diode according to another embodiment of the inventive concept. FIG. 21 is a side-sectional view illustrating optical coupling between the superluminescent diode and a planar lightwave circuit (PLC) device of FIG. 20.

Referring to FIGS. 20 and 21, a superluminescent diode 100 according to another embodiment of the inventive concept a second upper clad layer 34 having thicknesses different from each other in an optical mode size conversion region 14 and an active region 12. Here, the thickness of the second upper clad layer 34 in the optical mode size conversion region 14 has thicker than that in the active region 12. The thickness of second upper clad layer 34 in the optical mode size conversion region 14 may have a thicker about twice than that in the active region 12. A planar lightwave circuit (PLC) device 200 may include a planar substrate 210, a planar lower clad layer 224, a polymer optical waveguide 226, and a planar upper clad layer 234. The planar substrate 210 may include a silicon substrate. Each of the planar lower clad layer 224 and the planar upper clad layer 234 may be formed of polymer. The thickness of from an active layer 26 to a passive waveguide layer 22 may have a less than that of the polymer optical waveguide 226. The thickness of the active layer 26 may have about 100 nm to about 150 nm. The passive waveguide layer 22 may have about 100 nm to about 150 nm. The thickness of the polymer optical waveguide 226 may have about 4 μm. The second upper clad layer 34 may have a thickness similar to that of the planar upper clad layer 234 in the optical mode size conversion region 14. The planar upper clad layer 234 may have a thickness of about 4 μm to about 6 μm.

Light beam 101 generated in the active region 12 may be emitted from the passive waveguide layer 22 into the polymer optical waveguide 226 of the PLC device 200. Also, the light beam 101 returning from the PLC device 200 into the superluminescent diode 100 may travel from the polymer optical waveguide 226 into the passive waveguide layer 22. Here, the light 101 traveling from the polymer optical waveguide 226 may significantly improve a light confinement effect because the second upper clad layer 34 on the passive waveguide region 60 has a thick thickness. Accordingly, as the second upper clad layer 34 on the passive waveguide region 60 is increased in thickness, a large amount of light 101 may be confined from the polymer optical waveguide 226.

Thus, the superluminescent diode according to another embodiment of the inventive concept may improve optical coupling efficiency.

FIGS. 22 to 28 are perspective views illustrating a process of manufacturing a superluminescent diode according to another embodiment of the inventive concept.

Figure 22:
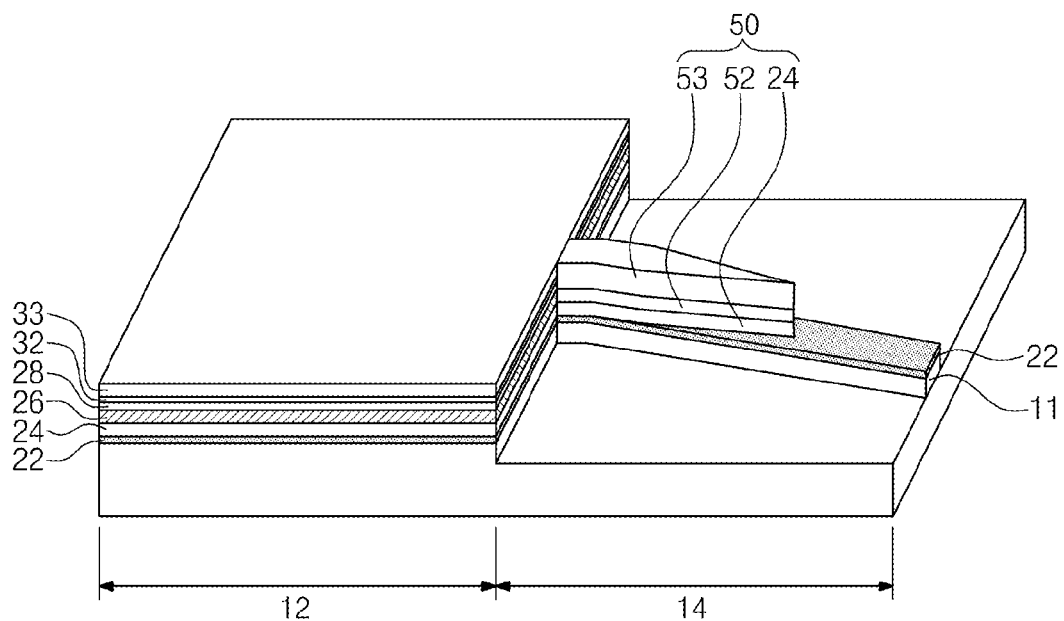
FIGS. 22 to 28 are perspective views illustrating a process of manufacturing a superluminescent diode according to another embodiment of the inventive concept.

Referring to FIGS. 2, 22, in a process of manufacturing a superluminescent diode according to another embodiment of the inventive concept, a tapered waveguide region 50 is formed in an optical mode size conversion region 14 on a substrate 10 and the passive waveguide layer 22 and the buffer layer 11 are patterned by a direction extending to the tapered waveguide region 50. The tapered waveguide region 50 may include a lower clad layer 24, and a second cap layer 53. The tapered waveguide region 50 may be formed by a photolithography process. The passive waveguide layer 22 and the buffer layer 11 may be a passive waveguide region 60. The passive waveguide region 60 may have a width of about 2 μm to about 7 μm. As above-described in an embodiment of the inventive concept, the active region 12 may include a passive waveguide layer 22 formed on the substrate 10, a lower clad layer 24, an active layer 26, a first upper clad layer 28, an etch stop layer 32, and a first cap layer 33.

Figure 23:
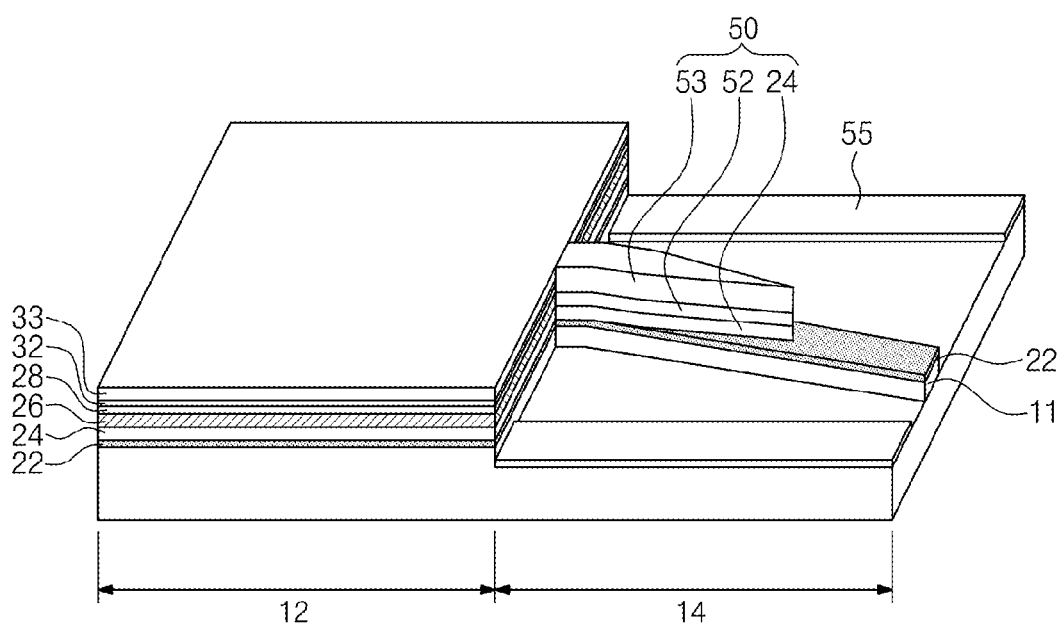

Referring to FIG. 23, mask patterns 55 are formed on both sides of the passive waveguide region 60 on the substrate 10. The mask patterns 55 may be formed of silicon nitride. The mask patterns 55 may be formed on both bottom surfaces of outside the passive ridge waveguide 60.

Figure 24:
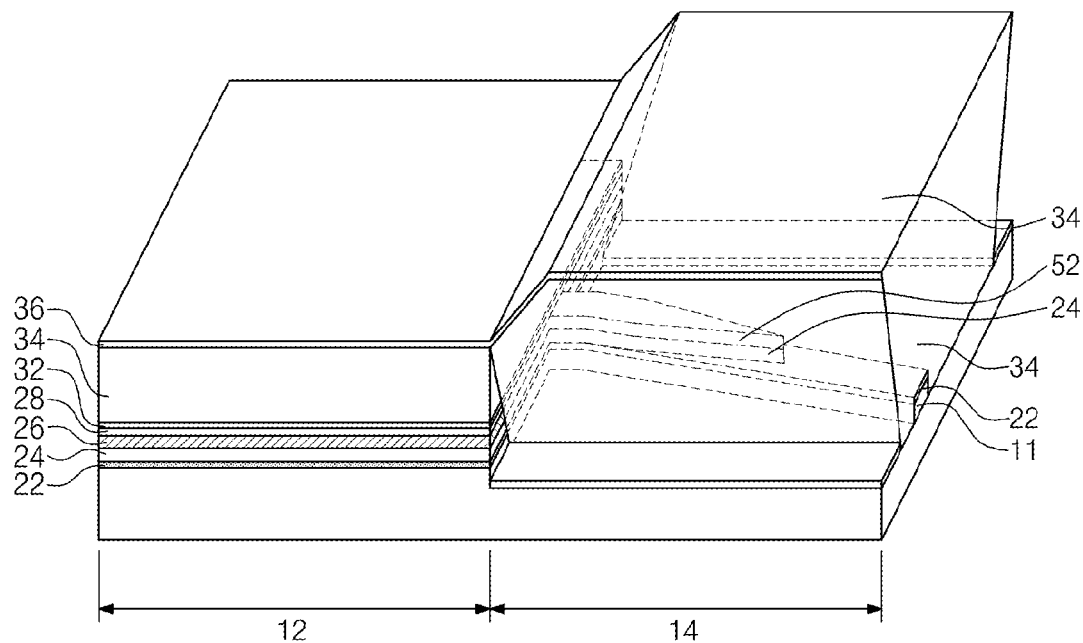

Referring to FIG. 24, a second upper clad layer 34 and an ohmic contact layer 36 are formed on the substrate 10. The second upper clad layer 34 may include p-InP equal to that of each of first and second cap layers 33 and 53. The second upper clad layer 34 may formed on an entire surface of the active region 12 with the same level as each other. The second upper clad layer 34 may be selectively grown on the substrate 10 which are exposed by the mask patterns 55 in the optical mode size conversion region 14. Thus, the second upper clad layer 34 may be formed through the selective growth method in the optical mode size conversion region 14. The selective growth method may grow the second upper clad layer 34 in the optical mode size conversion region 14 at a speed quicker about twice than in the active region 12. This is done because the second upper clad layer 34 is concentratedly formed on the substrate 10 exposed by the mask patterns 55 in the optical mode size conversion region 14. Thus, the second upper clad layer 34 may be formed with a thicker thickness in the optical mode size conversion region 14 than the active region 12. For example, the second upper clad layer 34 may have a thickness of about 1.7 μm to about 3 μm in the active region 12 and a thickness of about 4 μm to about 6 μm in the optical mode size conversion region 14. The ohmic contact layer 36 may include p+-InGaAs with a thickness of about 0.1 μm to about 0.3 μm.

Figure 25:
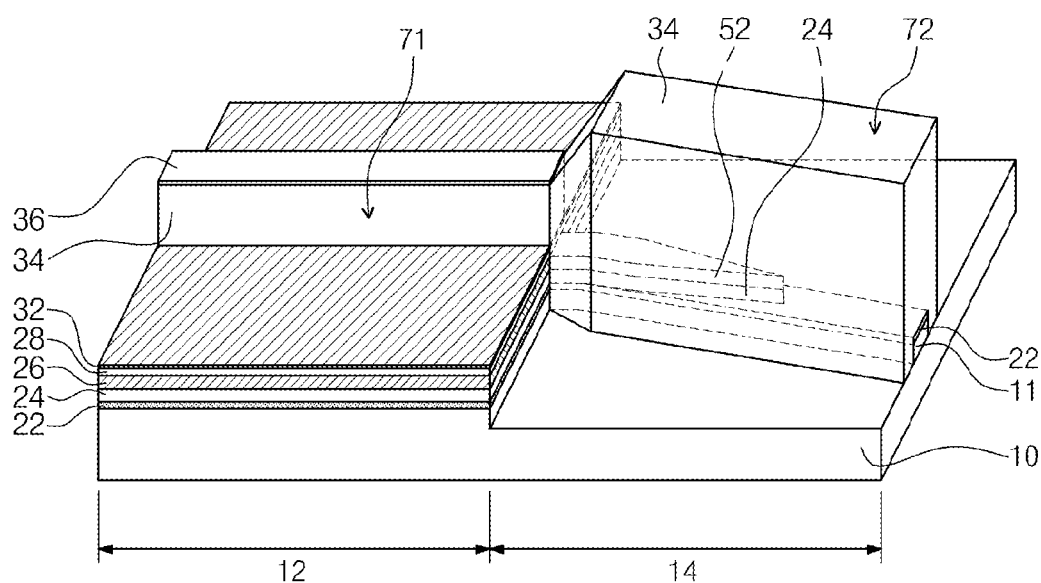

Referring to FIGS. 2, 20 and 25, the ohmic contact layer 36 and the second upper clad layer 34 may be patterned to form a ridge waveguide 71 in the active region 12 and a deep ridge waveguide 72 in the optical mode size conversion region 14. The ridge waveguide 71 may include the second upper clad layer 34 and the ohmic contact layer 36 on the etch stop layer 32. The second upper clad layer 34 and the ohmic contact layer 36 may have a reverse mesa structure (FIG. 3) or a forward mesa structure (FIG. 4). The deep ridge waveguide 72 may include the tapered waveguide region 50 and the passive waveguide region 60. The tapered waveguide region 50 may include a linear waveguide region 54, a bent waveguide region 56, and a taped waveguide region 58.

Figure 26:
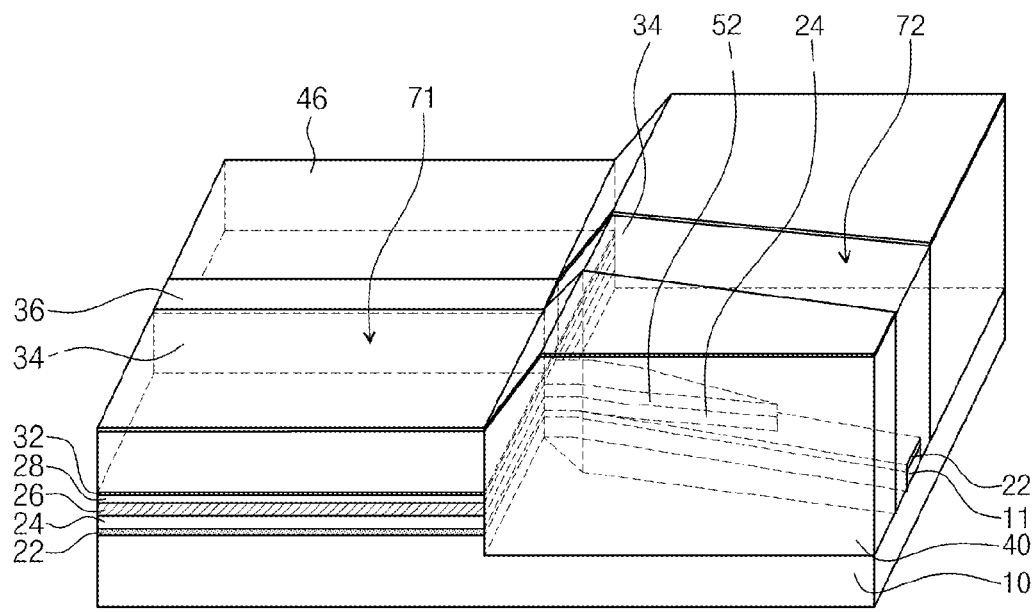

Referring to FIG. 26, a planarizing layer 40 is formed on the active region 12 and the optical mode size conversion region 14. The planarizing layer 40 may include polyimide or polymer BCB formed through spin coating.

Figure 27:
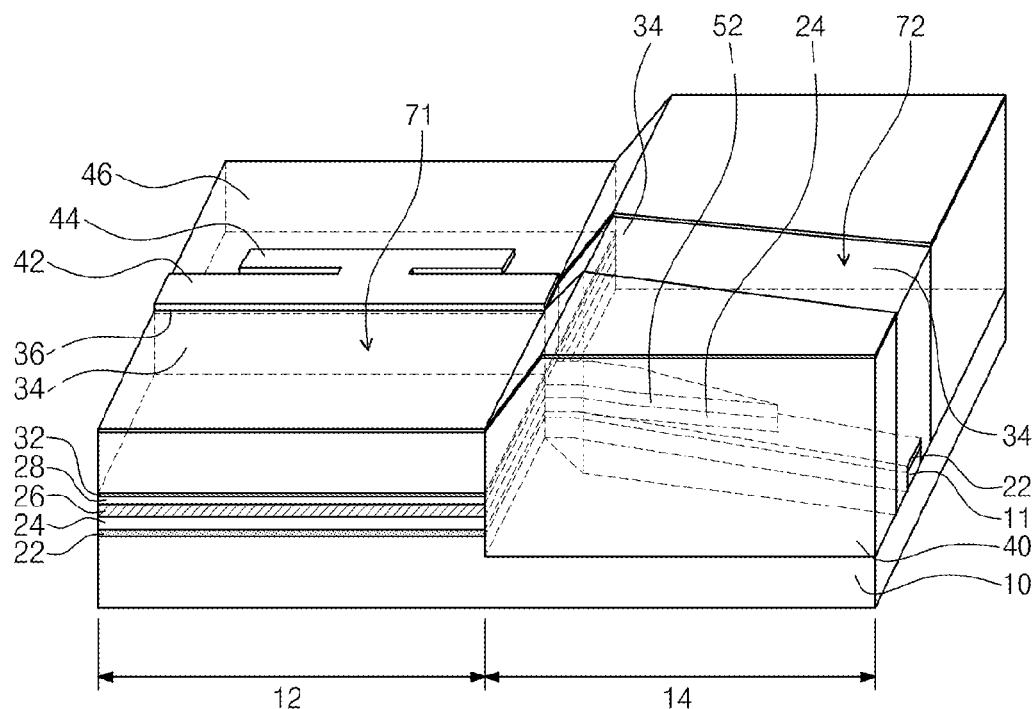

Referring to FIG. 27, an upper electrode 42 and a first pad 44 are formed on the ohmic contact layer 36 and the planarizing layer 40 of the active region 12, respectively. Each of the upper electrode 42 and the first pad 44 may be formed of a conductive metal. The upper electrode 42 and the first pad 44 may be patterned through a photolithography process.

Figure 28:
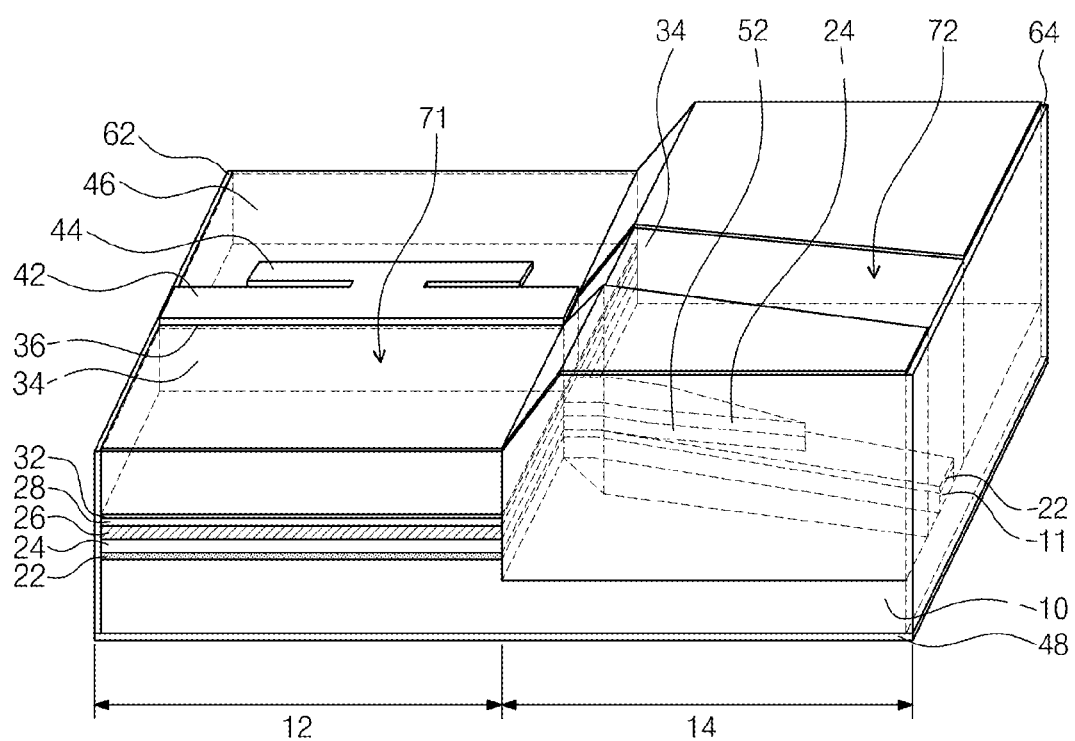

Referring to FIG. 28, a dielectric 46 is formed on the planarizing layer 40. Also, a HR-coating 62 is formed on a rear facet of the active region 12, and an AR-coating 64 is formed on a front facet of the optical mode size conversion region 14. A lower electrode 48 is formed on a bottom of the substrate 10. The dielectric 46 may include a silicon nitride layer. The lower electrode 48 may be formed of a conductive metal.

Figure 29:
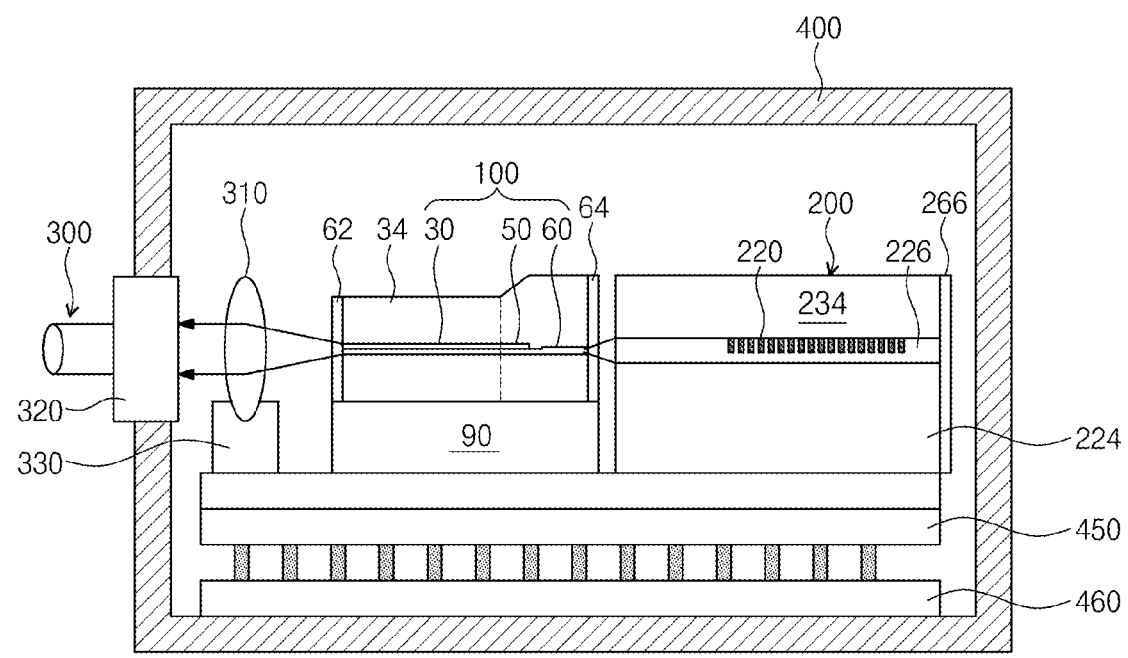
FIGS. 29 and 30 are side and floor plan views illustrating a modified example of a wavelength-tunable external cavity laser according to an embodiment of the inventive concept.
Figure 30:
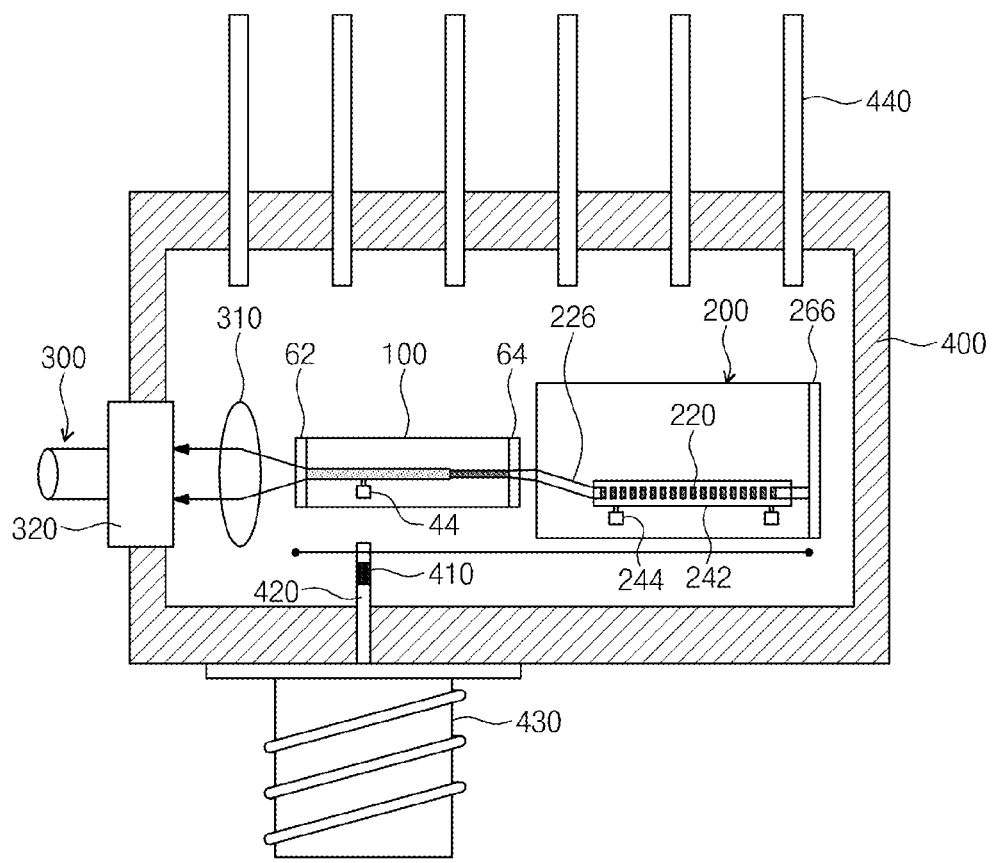

FIGS. 29 and 30 are side and floor views illustrating a modified example of a wavelength-tunable external cavity laser according to an embodiment of the inventive concept.

Referring to FIGS. 2, 29 and 30, a modified wavelength-tunable external cavity laser according to an embodiment of the inventive concept may include an optical fiber 300 disposed on one side of a superluminescent diode 100 and an PLC device 200 disposed on the other side facing the optical fiber 300. The superluminescent diode 100 may generate laser beam in a ridge waveguide 71. A tapered waveguide region 50 and a passive waveguide region 60 of the superluminescent diode 100 may be disposed inclined at an angle of about 5° to about 7° with respect to the ridge waveguide 71. The laser beam generated in the superluminescent diode 100 may resonate by the PLC device 200.

The PLC device 200 may include a polymer optical waveguide 226, a Bragg grating 220 disposed on the polymer optical waveguide 226, and a HR-coating 266 disposed on a rear facet of the polymer optical waveguide 226. The polymer optical waveguide 226 may be disposed inclined at an angle of about 15° to about 25° with respect to the ridge waveguide 71. The polymer optical waveguide 226 may be disposed between a planar lower clad layer 224 and a planar upper clad layer 234. The polymer optical waveguide 226 may have an effective refractive index of about 1.39. The polymer optical waveguide 226 may have an effective refractive index difference of about 0.09. Also, the polymer optical waveguide 226 may have a thermooptic coefficient of about $2.636 \times 10^{-4}$/° C. Since the polymer optical waveguide 226 has a thermooptic coefficient greater than that of the waveguide formed of a silicon material, a variable characteristic of the refractive index may be increased according to a temperature than current applied into a first electrode 242 and a second pad 244. A thermoelectric cooler 460 may adjust a temperature of the polymer optical waveguide 226.

The laser light traveling in the superluminescent diode 100 may resonate by the Bragg grating 220. The Bragg grating 220 may be disposed with a predetermined period in the polymer optical waveguide 226. Laser light having a wavelength corresponding to the period of the Bragg grating 220 may return to the superluminescent diode 100. Thus, laser beam having a wavelength corresponding to the period of the Bragg grating 220 may be oscillated. The HR coating 266 may be disposed on a rear facet of the polymer optical waveguide 226 facing the superluminescent diode 100. The high reflective coating 266 may reflect laser beam traveling in the polymer optical waveguide 226. The high reflective coating 266 may totally reflect the laser beam. The AR coating 62 of the superluminescent diode 100 may reflect the laser beam of about 4% to about 10%. The laser light may be outputted through the optical fiber 300. A lens 310 may be disposed between the optical fiber 300 and the superluminescent diode 100.

A housing 400 may surround the lens 310, the superluminescent diode 100, and PLC device 200. The optical fiber 300 may connected to a first support block 320 coupled to an opening of the housing 400 adjacent to the lens 310. The optical fiber 300 may be withdrawn from the inside of the housing 400 to the outside. The lens 310 may be disposed on a second support block 330. The thermoelectric cooler 460 may be disposed on a bottom of the housing 400. The thermoelectric cooler 460 may be disposed on a sub mount 450. The sub mount 450 may include silica. A third support block 90 may locate waveguides 30, 50, and 60 of the superluminescent diode 100 on the sub mount 450 with the same level as that of the polymer optical waveguide 226 of the PLC device 200. A lead frame 440 and a high frequency connector 430 may transmit electrical signals from the outside of the housing 400 into the PLC device 200 and the superluminescent diode 100. The high frequency connector 430 may be connected to a high frequency frame 420. An impedance matching resistor 410 may be connected between the high frequency frame 420 and the high frequency connector 430.

Figure 31A:
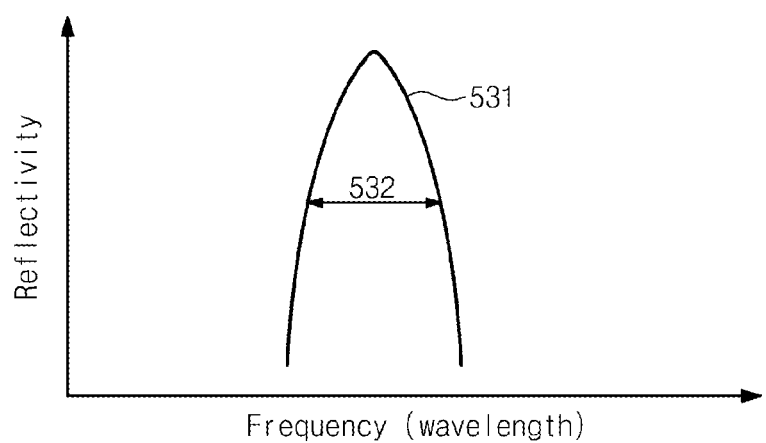
FIG. 31A is a graph illustrating the reflectivity according to a frequency (wavelength) of laser light in a Bragg grating.
Figure 31B:
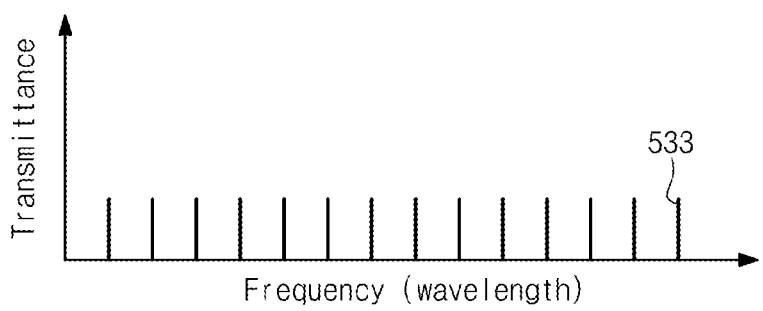
FIG. 31B is a graph illustrating a fabry-perot mode of laser light generated by the Bragg grating.

FIG. 31A is a graph illustrating the reflectivity according to a frequency (wavelength) of laser light in a Bragg grating. FIG. 31B is a graph illustrating a fabry-perot mode of laser light generated by the Bragg grating. FIG. 3C is a graph illustrating the transmittance according to a frequency (wavelength) of laser light oscillated from the Bragg grating.

Referring to FIGS. 29 to 31C, a Bragg grating 220 has a first peak 531 having a high reflectivity at a specific frequency (wavelength). Also, the Bragg grating 220 may oscillate laser light having a specific frequency (wavelength) 534 corresponding to a fabry-perot mode 533 having a certain transmittance generated in an external resonator. A frequency (wavelength) of laser light may have discontinuous Gaussian distribution. The Bragg grating 220 may have a 3-dB bandwidth 532 of about 0.3 mm or less. The 3-dB bandwidth 532 may be decided by a refractive index difference of the Bragg grating 220 and adjusted by a period and depth of the Bragg grating 220.

Figure 31C:
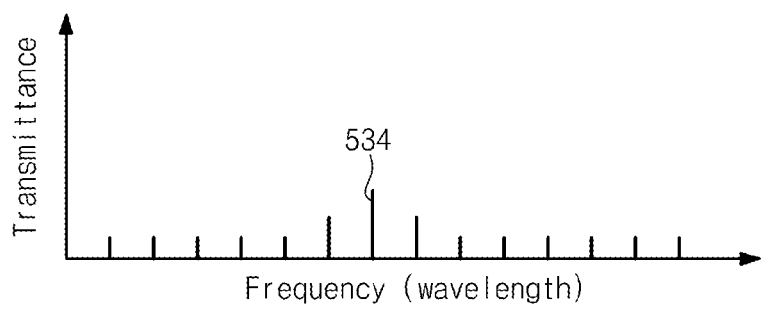
FIG. 31C is a graph illustrating the transmittance according to a frequency (wavelength) of laser light oscillated from the Bragg grating.
Figure 32:
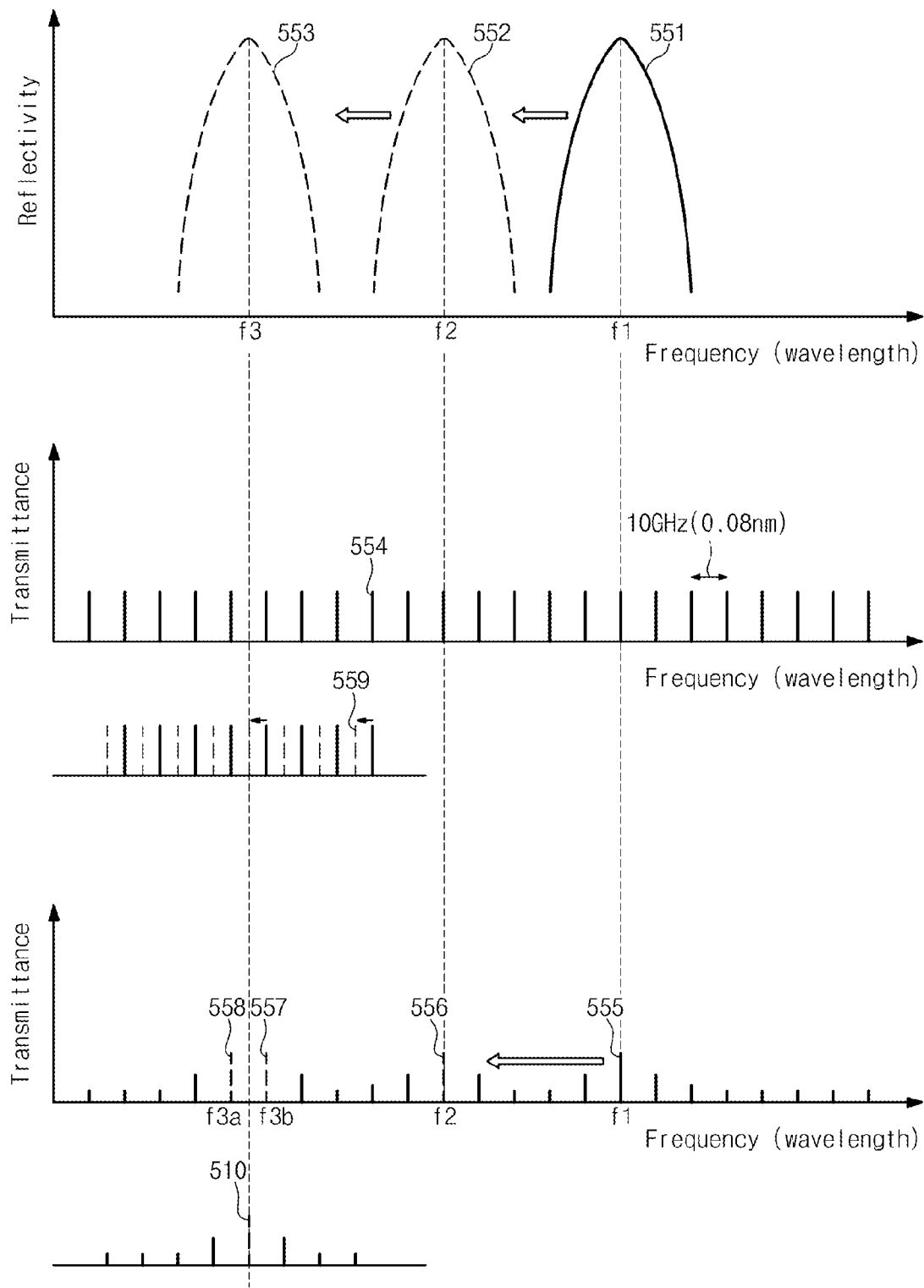
FIG. 32 is a graph illustrating wavelength-tunable characteristics of the laser light of FIGS. 31A to 31C.

FIG. 32 is a graph illustrating wavelength-tunable characteristics of the laser light of FIGS. 31A to 31C.

Referring to FIGS. 29 to 32, the PLC device 200 may have a refractive index changed according to current applied into a polymer component. Here, first to third reflectivity peaks 551, 552, and 553 may be successively changed depending on a frequency (wavelength) according to the change of the refractive index (a). A first fabry-perot mode 554 may be changed in distance according to a length of a resonator of an external cavity laser. For example, the first fabry-perot mode 554 may have a frequency (wavelength) distance of about 10 GHz (about 0.08 nm) (b). Also, when a length of the resonator of the external cavity laser is increased, the first fabry-perot mode 554 may have a frequency (wavelength) of about 10 GHz or less. The PLC device 200 may oscillate first and second resonant frequencies (wavelengths) 555 and 556 corresponding to the first fabry-perot mode 554 which satisfies a 3-dB bandwidth within the first and second reflectivity peaks 551 and 552 (c). The fabry-perot modes 554 corresponding to central frequencies of the first and second reflectivity peaks 551 and 552 may correspond to the first and second resonant frequencies (wavelengths) 555 and 556, respectively. On the other hand, the third reflectivity peak 553 may be distributed into third and fourth resonant frequencies 557 and 558 within the 3-dB bandwidth because a central frequency of the third reflectivity peak 553 does not correspond to the first fabry-perot mode 554. Since the third and fourth resonant frequencies 557 and 558 are oscillated at the same time, the laser light may have a low SMSR characteristic. Here, the first fabry-perot mode may be chanted into a second fabry-perot mode 559 (d) by controlling current applied into the active region 12 of the superluminescent diode 100 to oscillate laser light having a fifth resonant frequency 570 (e). Thus, since the second fabry-perot mode corresponds to the resonant frequency of the third reflectivity peak 553, the laser light having the fifth resonant frequency 570 may have a superior SMSR characteristic.

As described above, according to the embodiments of the present invention, the planarizing layer formed of the polyimide material may be disposed on each of both sides of the active waveguide. The electrode may be disposed on the active waveguide layer. The pad may be connected to the electrode on the planarizing layer. The planarizing layer may minimize the parasitic capacitance between the pas and the active layer. Thus, the superluminescent diode according to the embodiments may be operated at a high speed of about 10 Gbps.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of manufacturing a superluminescent diode, the method comprising:
   forming a passive waveguide layer, a lower clad layer, an active layer, and a first upper clad layer on a substrate having an active region and an optical mode size conversion region;
   removing the active layer and the first upper clad layer in the optical mode size conversion region;
   forming a tapered waveguide region connected the active layer and the first upper clad layer on the lower clad layer in the optical mode size conversion region; forming a passive waveguide region connected tapered waveguide region; and
   forming a second upper clad layer having a mesa structure on the first upper clad layer in the active region, and surrounding the tapered waveguide region and the passive waveguide region in the optical mode size conversion region.

2. The method of claim 1, further comprising forming an etch stop layer and a first cap layer on the first upper clad layer.

3. The method of claim 2 wherein the tapered waveguide region comprises a junction layer, the junction layer is butt-regrown with the same thickness as that of the active layer of the active region.

4. The method of claim 3, further comprising forming a second cap layer having the same thickness as that of each of the first upper clad layer, the etch stop layer, and the first cap layer on the junction layer.

5. The method of claim 4, wherein the second upper clad layer comprises doped p-InP equal to that of each of the first and second cap layers.

6. The method of claim 5, wherein the second upper clad layer of the optical mode size conversion region is formed through a selective growth method.

7. The method of claim 6, wherein the selective growth method comprises:
   forming mask patterns on the substrate out of the tapered waveguide region and the passive waveguide region; and
   forming the second upper clad layer on the tapered waveguide region, the passive waveguide, and the substrate which are exposed by the mask patterns.

8. The method of claim 5, further comprising:
   forming an ohmic contact layer on the second upper clad layer;
   forming planarizing layers on sides of the ridge waveguide, the tapered waveguide region, and the passive waveguide region on the substrate; and
   forming an electrode and a pad on an ohmic contact layer and the planarizing layer etch other.

* * * * *